United States Patent
Shin et al.

(10) Patent No.: US 9,640,245 B2
(45) Date of Patent: May 2, 2017

(54) SEMICONDUCTOR DEVICE AND OPERATING METHOD THEREOF

(71) Applicant: SK hynix Inc., Gyeonggi-do (KR)

(72) Inventors: Sun-Hye Shin, Gyeonggi-do (KR); Nak-Kyu Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/798,176

(22) Filed: Jul. 13, 2015

(65) Prior Publication Data

US 2016/0232961 A1    Aug. 11, 2016

(30) Foreign Application Priority Data

Feb. 6, 2015   (KR) .................. 10-2015-0018637

(51) Int. Cl.
G11C 7/10       (2006.01)
G11C 11/408     (2006.01)
G11C 11/4076    (2006.01)

(52) U.S. Cl.
CPC ........ G11C 11/4087 (2013.01); G11C 7/1027 (2013.01); *G11C 7/1042* (2013.01); *G11C 11/4076* (2013.01); *G11C 2207/005* (2013.01)

(58) Field of Classification Search
CPC ....................................................... G11C 7/10
USPC ..................................................... 365/189.05
See application file for complete search history.

(56) References Cited

U.S. PATENT DOCUMENTS 5,995,430 A * 11/1999 Yabe ................ G11C 7/10
                                                  365/189.05

FOREIGN PATENT DOCUMENTS

KR   1019990079276   11/1999
KR   1020030042906    6/2003

* cited by examiner

*Primary Examiner* — Jason Lappas
(74) *Attorney, Agent, or Firm* — I P & T Group LLP

(57) ABSTRACT

A semiconductor memory device includes a plurality of memory cell blocks each including a plurality of word lines and suitable for being selectively activated based on an active command and a row address, wherein word lines are selected from the respective activated memory cell blocks based on the active command and the row address, and a column decoding block sequentially accessing the activated memory cell blocks to input/output data thereof by decoding a column address based on the row address.

12 Claims, 3 Drawing Sheets

SEMICONDUCTOR DEVICE AND OPERATING METHOD THEREOF

CROSS-REFERENCE TO RELATED APPLICATIONS

The present application claims priority of Korean Patent Application No. 10-2015-0018637, filed on Feb. 6, 2015, which is incorporated herein by reference in its entirety.

BACKGROUND

1. Field

Various embodiments of the present invention relate to a semiconductor design technology and, more particularly, to a semiconductor memory device and an operating method thereof.

2. Description of the Related Art

Semiconductor memory devices, such as double data rate synchronous DRAM (DDR SDRAM), generally include tens of millions of memory cells for storing data. The memory cells may be arranged in an array according to a defined set of parameters. For example, semiconductor memory devices may have memory banks in which a plurality of memory cell blocks share an input/output line and perform a single read/write operation at a time.

FIG. 1 is a block diagram for explaining the inner workings of a conventional semiconductor memory device. FIG. 1 illustrates the structure of one memory bank of a semiconductor memory device. However, the semiconductor memory device may include a plurality of memory banks.

Referring to FIG. 1, the semiconductor memory device includes a memory cell array 110, a word line activation unit 120, and a column decoding unit 130. The memory cell array 110 includes a memory bank BA having a plurality of memory cells coupled to a plurality of word lines (row lines) and bit lines (column lines).

The word line activation unit 120 generates row selection signals WLs in response to a row address ADD_ROW inputted from an exterior (i.e. form an external source). The memory bank BA may activate one word line selected by the row selection signals WLs.

The column decoding unit 130 generates column selection signals YIs in response to a column address ADD_COL inputted from an exterior. The semiconductor memory may perform a read/write operation by accessing a memory cell corresponding to the column selection signals YIs among memory cells coupled to a word line activated by the row selection signals WL.

When the row address ADD_ROW is inputted from an exterior, the word line activation unit 120 selectively activates the row selection signals WLs in response to the row address ADD_ROW, so that one word line corresponding to the row address ADD_ROW is activated among the word lines of the memory bank BA. Then, when the column address ADD_COL is inputted from an exterior, the column decoding unit 130 selectively activates the column selection signals YIs in response to the column address ADD_COL, so that a bit line corresponding to the activated column selection signal is selected and data of a memory cell selected from memory cells coupled to the activated word line is sensed.

That is, for performing a read/write operation, the semiconductor memory device selects a word line and a bit line of the memory bank BA, and accesses a memory cell corresponding to the selected lines. The memory bank BA has a plurality of memory cell blocks sharing an input/output line, and activates only one word line at a time, and performs a read/write operation corresponding to the activated word line. That is, for stable operation, when data of memory cells coupled to the activated word line is transmitted to respective bit lines, a potential difference between a bit line pair is detected and amplified, and then the column selection signals YIs, based on a read/write command, is activated.

Accordingly, the semiconductor memory device having the memory bank BA structure activates one word line at a time and performs the read/write operation after a time interval corresponding to tRCD (RAS to CAS Delay, i.e., a delay time from the input of an active command to the input of a read/write command). However, such an operation may reduce the data availability of the semiconductor memory device, resulting in a decrease in operation efficiency.

SUMMARY

Various embodiments are directed to a semiconductor memory device that activates a plurality of memory cell blocks and sequentially accesses the activated memory cell blocks by decoding a column address, and an operating method thereof.

In an embodiment, a semiconductor memory device may include: a plurality of memory cell blocks each including a plurality of word lines and suitable for being selectively activated based on an active command and a row address, wherein word lines are selected from the respective activated memory cell blocks based on the active command and the row address; and a column decoding block suitable for sequentially accessing the activated memory cell blocks to input/output data thereof by decoding a column address based on the row address.

In an embodiment, an operation method of a semiconductor memory device may include: inputting an active command and a row address, activating a plurality of memory cell blocks, and selecting one of a plurality of word lines of the activated memory cell blocks; and continuously inputting read/write commands and a column address, and decoding the column address and the row address to sequentially access the activated memory cell blocks.

In an embodiment, a semiconductor memory device may include: a plurality of memory cell blocks suitable for sharing column lines, wherein each of the memory cell blocks includes a plurality of row lines; a row circuit suitable for activating row lines based on an active command and a row address, wherein the activated row lines are included in different memory cell blocks from each other; and a column circuit suitable for sequentially selecting sub-columns corresponding to the memory cell blocks including the activated row lines based on a column address and the row address.

In an embodiment, an operation method of a semiconductor memory device may include: activating a plurality of word lines included in different memory cell blocks from each other, based on an active command and a row address; and selecting a bit line by decoding a column address in response to sequentially inputted read/write commands, and sequentially allowing the selected bit line to be accessed by memory cells corresponding to the activated word lines based on the row address.

DETAILED DESCRIPTION

Figure 1:
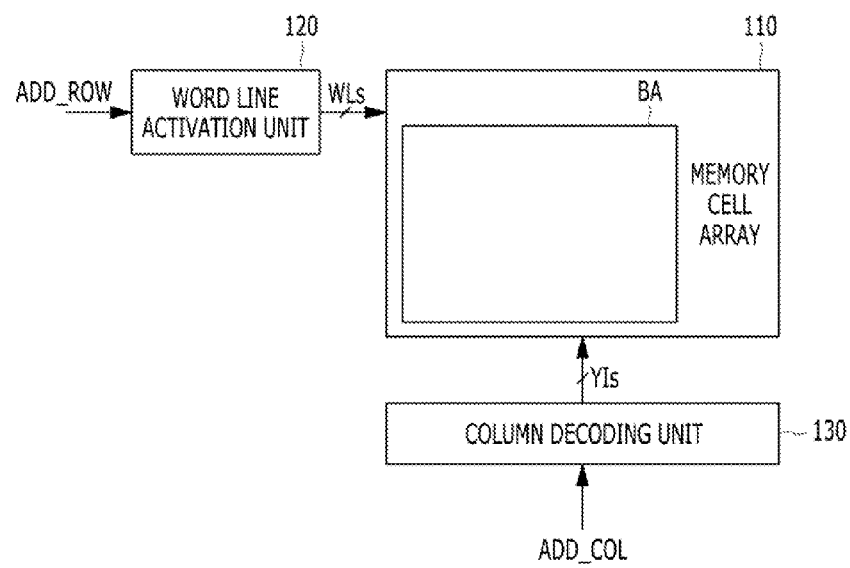
FIG. 1 is a block diagram illustrating a conventional semiconductor memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

The drawings are not necessarily to scale and, in some instances, proportions may have been exaggerated in order to clearly illustrate features of the embodiments. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
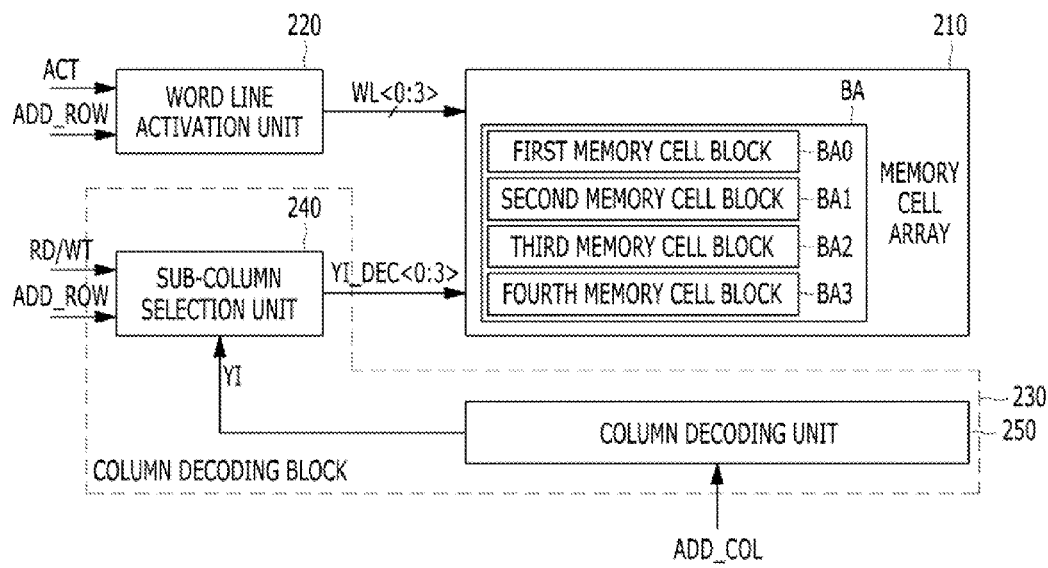
FIG. 2 is a block diagram illustrating a semiconductor memory device in accordance with an embodiment of the present invention.

FIG. 2 is a block diagram illustrating a semiconductor memory device in accordance with an embodiment of the present invention. FIG. 2 illustrates a structure corresponding to one memory bank of the semiconductor memory device. However, the semiconductor memory device may include a plurality of memory banks.

Referring to FIG. 2, the semiconductor memory device may include a memory cell array 210, a word line activation unit (or a row circuit) 220, and a column decoding block (or a column circuit) 230.

The memory cell array 210 may include a memory bank BA having a plurality of memory cells that are grouped into first to fourth memory cell blocks BA0 to BA3. Each memory cell block may include a plurality of word lines to which memory cells are coupled. The memory cell blocks may be coupled to a corresponding bit line sense amplifier (not illustrated) and share bit lines.

The word line activation unit 220 generates row selection signals in response to a row address ADD_ROW inputted from an exterior (i.e. from an external source). The word line activation unit 220 may activate row selection signals WL<0:3> respectively corresponding to the first to fourth memory cell blocks BA0 to BA3, and select word lines included in the respective memory cell blocks. The word line activation unit 220 may simultaneously activate the row selection signals WL<0:3> in response to an active command ACT inputted from an exterior. The word line activation unit 220 may generate the row selection signals WL<0:3> by decoding a part of bits of the row address ADD_ROW.

The column decoding block 230 decodes a column address ADD_COL based on the row address ADD_ROW to output sub-column selection signals YI_DEC<0:3>, and selects a memory cell block corresponding to the sub-column selection signals YI_DEC<0:3> among the first to fourth memory cell blocks BA0 to BA3. As a consequence, a bit line (i.e., a sub-column) corresponding to the sub-column selection signals YI_DEC<0:3> is selected from a corresponding cell block, and data of a memory cell coupled to the selected bit line among the memory cells coupled to the word line activated by the word line activation unit 220 is sensed. The column decoding block 230 includes a sub-column selection unit 240 and a column decoding unit 250.

The column decoding unit 250 may have substantially the same structure as that of the column decoding unit 130 shown in FIG. 1 and may operate similarly to the column decoding unit 130. The column decoding unit 250 selectively activates a column selection signal YI corresponding to the column address ADD_COL, so that a bit line corresponding to the activated column selection signal YI is selected. In FIG. 2, the activated column selection signal YI is illustrated as an example among column selection signals YIs (not illustrated).

The sub-column selection unit 240 receives the row address ADD_ROW and the activated column selection signal YI, and generates sub-column selection signals YI_DEC<0:3>, in response to a read/write command RD/WT. That is, the column decoding block 230 may sequentially select sub-columns that correspond to the activated column selection signal YI, by decoding the column address ADD_COL and the row address ADD_ROW. The sub-column selection unit 240 may include a decoding circuit for the row address ADD_ROW, or may use the row selection signals WL<0:3> as the row address ADD_ROW.

Figure 3:
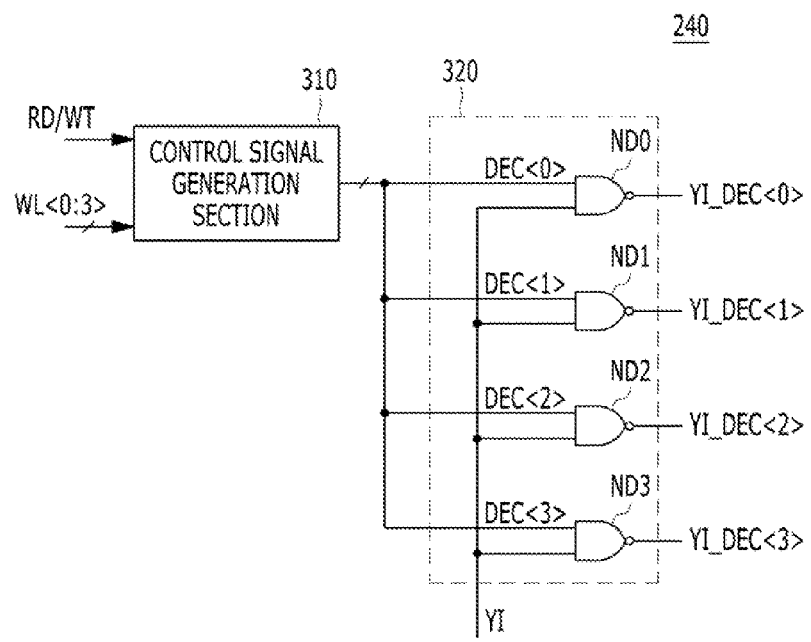
FIG. 3 is a detailed diagram of a sub-column selection unit shown in FIG. 2.

FIG. 3 is a detailed diagram of the sub-column selection unit 240 shown in FIG. 2.

Referring to FIG. 3, the sub-column selection unit 240 may include a control signal generation section 310 and a signal combination section 320.

The control signal generation section 310 may generate control signals DEC<0:3> based on the row selection signals WL<0:3> and the read/write command RD/WT. The control signal generation section 310 may activate the respective control signals DEC<0:3> in response to the activated row selection signals WL<0:3>. Some of the bits of the ADD_ROW may be used instead of control signals DEC<0:3>. The control signal generation section 310 may sequentially activate the control signals DEC<0:3> according to the read/write command RD/WT inputted from an exterior after the active command ACT is inputted.

For example, when the word line activation unit 220 activates the first and third row selection signals WL<0> and WL<2> in response to the active command ACT and the row address ADD_ROW, the control signal generation section 310 sequentially activates the first and third control signals DEC<0> and DEL<2> in response to the activated first and third row selection signals WL<O> and WL<2> and the read/write command RD/WT. A bit line is selected by the activated column selection signal YI. The control signals DEC<0:3> may have information to decide which memory cell block (or a sub-column) is to be selected. That is, a column is selected by the column address ADD_COL and a sub-column is selected by the row address ADD_ROW.

The signal combination section 320 combines the control signals DEC<0:3> with the corresponding column selection signal YI and outputs the sub-column selection signals YI_DEC<0:3>. The signal combination section 320 may include first to fourth NAND gates ND0 to ND3, logically combine the first to fourth control signals DEC<0:3> with the corresponding column selection signal YI, and output the first to fourth sub-column selection signals YI_DEC<0:3>. The signal combination section 320 may be provided for the respective column selection signals YIs (not illustrated).

Figure 4:
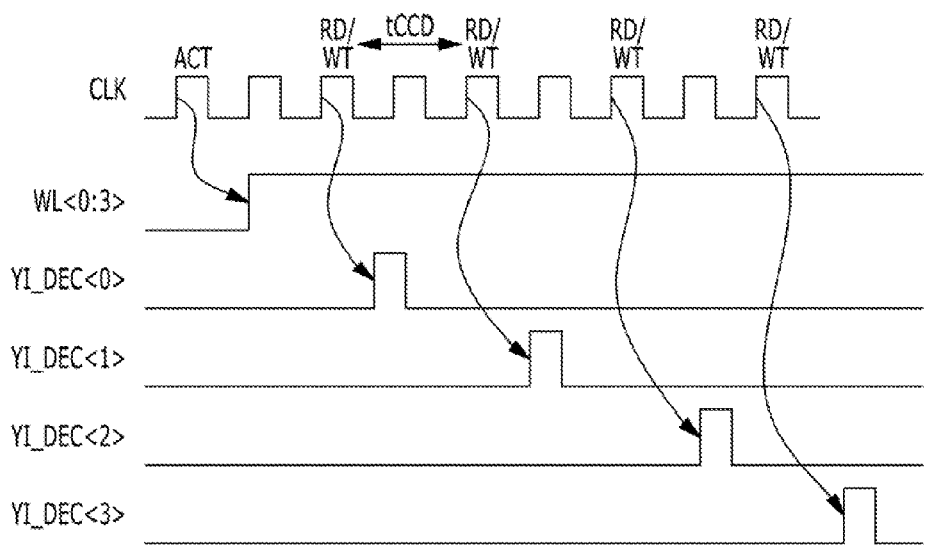
FIGS. 4 and 5 are waveform diagrams for describing an operation of the semiconductor memory device shown in FIGS. 2 and 3.

FIG. 4 is a waveform diagram for describing an operation of the semiconductor memory device shown in FIGS. 2 and 3. For reference, in FIG. 4, 'CLK' denotes a system clock. The semiconductor memory device operates while being synchronized with the system clock CLK.

When the active command ACT is inputted from an exterior, the word line activation unit 220 activates the row selection signals WL<0:3> in response to the row address ADD_ROW. FIG. 4 illustrates that the first to fourth row selection signals WL<0:3> are simultaneously activated in response to the first to fourth memory cell blocks BA0 to BA3. That is, one word line is selected from each of the first to fourth memory cell blocks BA0 to BA3, and the selected word lines are simultaneously activated.

Then, the semiconductor memory device sequentially performs read/write operations for the inputted read/write commands RD/WTs. The control signal generation section 310 may sequentially activate the control signals DEC<0:3> in response to the read/write commands RD/WTs according to the activated row selection signals WL<0:3>. The column selection signal YI is activated by the column address ADD_COL is decoded using the control signals DEC<0:3 in the read/write operations. The control signals DEC<0:3> are activated according to the row selection signals WL<0:3>, and then the control signals DEC<0:3> are combined with the corresponding column selection signal YI to generate the sub-column selection signals YI_DEC<0:3> that correspond to the respective memory cell blocks BA0 to BA3 and are sequentially activated. Sub-columns corresponding to the respective memory cell blocks BA0 to BA3 are sequentially selected in response to the sub-column selection signals YI_DEC<0:3>, and memory cells corresponding to the sub-columns selected from among memory cells coupled to the activated word lines are accessed, so that data is sequentially inputted or outputted. After all the read/write operations are performed, the semiconductor memory device may perform a precharge operation for the corresponding memory bank BA.

That is, the semiconductor memory device may activate word lines selected from a plurality of memory cell blocks in a single active operation, and may continuously perform a number of read/write operations that corresponds to the activated word lines. The respective read/write operations may be continuously performed without separate active operations. For example, the respective read/write operations may be performed with a time interval corresponding to tCCD (CAS to CAS delay: a time for which a column selection signal is activated to transfer data, a data transfer line is precharged, and then a next column selection signal is activated). With such an operation, a data input/output speed of the semiconductor memory device may be increased, resulting in the improvement of the data availability and the system availability of the semiconductor memory device.

Figure 5:
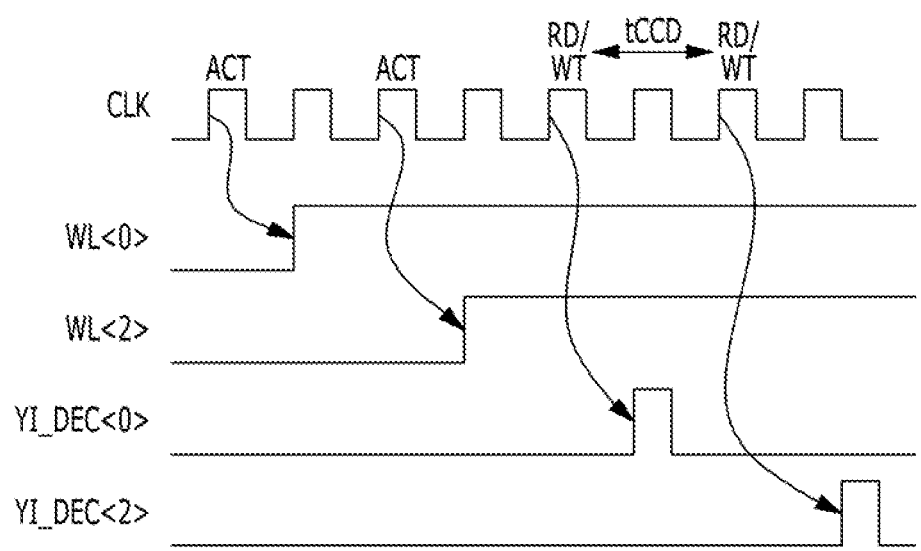

FIG. 5 is a waveform diagram for describing an operation of the semiconductor memory device shown in FIGS. 2 and 3.

Referring to FIG. 5, the row address ADD_ROW changes whenever an active command ACT is inputted, and row selection signals WL<0> and WL<2> are sequentially activated. That is, the first row selection signal WL<0> is activated in response to a first active command ACT, and the third row selection signal WL<2> is activated in response to a second active command ACT. In response to the activated first and third row selection signals WL<0> and WL<2>, one word line is selected and activated from each of the corresponding first and third memory cell blocks BA0 and BA2.

Then, an operation of the semiconductor memory device after read/write commands RD/WTs are inputted is similar to the embodiment described in FIG. 4. That is, the semiconductor memory device may activate word lines one by one from a plurality of memory cell blocks through a continuous active operation, and continuously perform read/write operations for the respective memory cell blocks, thereby reducing a time interval between the read/write operations and to increase a data input/output speed of the semiconductor memory device having a cell array structure.

As described above, the semiconductor memory device in accordance with the embodiments of the present invention may activate a plurality of memory cell blocks and respective word lines included therein, decode a column address based on the activated memory cell blocks, and sequentially input/output data to/from the activated memory cell blocks, so that it is possible to minimize a time interval between the input/output operations and to maximize data availability.

Although various embodiments have been described for illustrative purposes, it will be apparent to those skilled in the art that various changes and modifications may be made without departing from the spirit and scope of the invention as defined in the following claims. For instance, the position and types of logic gates in the aforementioned embodiments could be realized differently depending on the activation levels of the signals.

What is claimed is:

1. A semiconductor memory device comprising:
a plurality of memory cell blocks each including a plurality of word lines and suitable for being selectively activated based on an active command and a row address, wherein word lines are selected from the respective activated memory cell blocks based on the active command and the row address; and
a column decoding block suitable for sequentially accessing the activated memory cell blocks to input/output data thereof, by decoding a column address and the row address,
wherein the column decoding block comprises:
a column decoding unit suitable for generating column selection signals based on the column address; and
a sub-column selection unit suitable for generating sub-column selection signals based on the column selection signals and the row address to sequentially access the activated memory cell blocks.

2. The semiconductor memory device of claim 1, wherein the memory cell blocks are simultaneously activated based on the active command and the row address.

3. The semiconductor memory device of claim 2, wherein the column decoding block sequentially accesses the activated memory cell blocks based on read/write commands continuously inputted after the active command is inputted.

4. The semiconductor memory device of claim 3, wherein the read/write commands are continuously inputted with a time interval corresponding to tCCD (CAS to CAS delay), and the column decoding block inputs/outputs the data based on the read/write commands.

5. The semiconductor memory device of claim 1, wherein the sub-column selection unit comprises:
a control signal generation section suitable for generating control signals which are selectively activated based on the row address; and a signal combination section suitable for combining the control signal with a corresponding column selection signal to output the sub-column selection signals.

6. The semiconductor memory device of claim 5, wherein the control signal generation section sequentially activates the control signals based on continuously inputted read/write commands.

7. The semiconductor memory device of claim 1, further comprising:
- a word line activation unit suitable for generating a plurality of row selection signals, which correspond to the respective memory cell blocks, based on the active command and the row address.

8. The semiconductor memory device of claim 1, wherein each of the memory cell blocks includes a memory cell mat coupled to a bit line sense amplifier to share a bit line.

9. An operation method of a semiconductor memory device, comprising:
- inputting an active command and a row address, activating a plurality of memory cell blocks, and selecting one of a plurality of word lines of the activated memory cell blocks; and
- continuously inputting read/write commands and a column address, and decoding the column address and the row address to sequentially access the activated memory cell blocks, wherein the decoding of the column address and the row address comprises:
- generating column selection signals based on the column address; and
- generating sub-column selection signals based on the column selection signals and the row selection signals to sequentially access the activated memory cell blocks.

10. The operation method of claim 9, wherein one of the word lines of the activated memory cell blocks is selected by generating a plurality of row selection signals corresponding to the respective memory cell blocks based on the row address.

11. The operation method of claim 10, wherein the decoding of the column address and the row address comprises:
- generating column selection signals based on the column address; and
- generating sub-column selection signals based on the column selection signals and the row selection signals.

12. The operation method of claim 9, further comprising:
- precharging the memory cell blocks after the activated memory cell blocks are sequentially accessed.

* * * * *